United States Patent [19]

Ikegaya et al.

[11] Patent Number: 5,435,815
[45] Date of Patent: Jul. 25, 1995

[54] CUTTING TOOL EMPLOYING VAPOR-DEPOSITED POLYCRYSTALLINE DIAMOND FOR CUTTING EDGE AND METHOD OF MANUFACTURING THE SAME

[75] Inventors: Akihiko Ikegaya; Keiichiro Tanabe; Toshiya Takahashi; Naoji Fujimori, all of Hyogo, Japan

[73] Assignee: Sumitomo Electric Industries, Ltd., Osaka, Japan

[21] Appl. No.: 84,298

[22] Filed: Jun. 29, 1993

[30] Foreign Application Priority Data

Jun. 30, 1992 [JP] Japan .................................. 4-173143
Jul. 3, 1992 [JP] Japan .................................. 4-176726

[51] Int. Cl.$^6$ ............................................ B24D 11/00
[52] U.S. Cl. ........................................ 51/295; 51/297; 51/308; 51/309
[58] Field of Search .................. 51/295, 308, 309, 297; 427/252

[56] References Cited

U.S. PATENT DOCUMENTS 3,663,191  5/1972  Kroder .................................. 51/295
4,250,210  2/1981  Crosby et al. ........................ 427/252
4,842,937  6/1989  Meyer et al. ......................... 428/408

FOREIGN PATENT DOCUMENTS 0279898  8/1988  European Pat. Off. .
0469204  2/1992  European Pat. Off. .
52-12126  4/1977  Japan .
1-153228  6/1989  Japan .
1-210201  8/1989  Japan .
1212767  8/1989  Japan .
3277412  12/1991  Japan .

*Primary Examiner*—Deborah Jones
*Attorney, Agent, or Firm*—W. G. Fasse; W. F. Fasse

[57] ABSTRACT

A diamond cutting tool has a tool substrate and a cutting edge member. The cutting edge member is formed of a material having a three-layer structure or a diamond composite material. When the material having a three-layer structure is employed, the cutting edge member is formed by a vapor-deposited diamond layer defining a rake face, a layer of a composite material of vapor-deposited diamond and a metal or ceramics, and a layer of the metal or ceramics. The metal is prepared from Mo, W, Cr, V, Nb, Ta, Co, Ni or Fe, while the ceramics is prepared from cBN, SiC, $Si_3N_4$, WC, TiC, TaC, NbC, $Cr_3C_2$, $Mo_2C$, VC, TiN or BN. The cutting edge member is brazed to the tool substrate through the metal or ceramics layer. When the diamond composite material is employed, on the other hand, the cutting edge member is formed of a composite material of particles or fibers of AlN, cBN or SiC and vapor-deposited diamond. The diamond cutting tool is excellent in heat resistance and durability.

24 Claims, 4 Drawing Sheets

CUTTING TOOL EMPLOYING VAPOR-DEPOSITED POLYCRYSTALLINE DIAMOND FOR CUTTING EDGE AND METHOD OF MANUFACTURING THE SAME

CROSS-REFERENCE TO RELATED APPLICATION

The present application is related to our copending U.S. patent application Ser. No. 08/028,324, filed on Mar. 9, 1993.

BACKGROUND OF THE INVENTION

1. Field of the Invention

The present invention relates to a diamond cutting tool, and more particularly, it relates to a cutting tool employing diamond which is formed by vapor deposition for its cutting edge and having excellent wear resistance and chipping resistance, and a method of manufacturing the same.

2. Background Information

Diamond, having high hardness and high thermal conductivity, is particularly useful as a tool material for cutting nonferrous metals such as Al alloys, graphite or ceramics. Diamond materials which are used as tool materials are classified into monocrystal and polycrystalline materials. Monocrystal diamond, which is excellent in physical characteristics, has disadvantages such as an extremely high cost, difficulty in working into a desired shape as a tool material, and cleavage.

On the other hand, polycrystalline diamond materials used as tool materials can be roughly divided into two types. The first one is sintered diamond, which is obtained by sintering fine diamond powder and an iron family metal such as Co under diamond-stable extra-high pressure and high-temperature conditions. Such a sintering technique is described in Japanese Patent Publication No. 52-12126 (1977), for example. It is known that, among commercially available sintered diamond materials, those having particle diameters of not more than several 10 μm have excellent wear resistance with no cleavage phenomenon observed in the aforementioned monocrystal diamond. However, since such sintered diamond contains several to several 10% of binder, a cutting edge of such diamond may be chipped due to diamond particles forming the sintered body falling out during cutting. Such a falling-out phenomenon remarkably appears as the wedge angle of the tool cutting edge is reduced, and it is difficult to ensure a long life of a sharp cutting edge of sintered diamond. Due to the binder contained therein, further, the sintered diamond is so inferior in heat resistance to the monocrystal diamond that the sintered diamond is easily worn during cutting.

On the other hand, vapor-deposited diamond, which is another type of polycrystalline diamond for a cutting tool, is superior in heat resistance and wear resistance to the sintered diamond and is hard to chip, since the same is dense and formed of only diamond. Such vapor-deposited diamond is generally prepared by chemical vapor deposition (CVD) by decomposing and exciting a raw material gas which is mainly composed of hydrocarbon, such as methane and hydrogen, under a low pressure.

For example, a diamond-coated tool comprising a tool substrate which is directly coated with diamond has been developed as a cutting tool employing vapor-deposited diamond. In such a diamond-coated tool, however, adhesion between the tool substrate and the as-formed diamond thin film is important. In a tool prepared by forming a diamond thin film on a substrate of cemented carbide, for example, there has been a problem that the diamond thin film separates from the substrate during cutting.

A diamond cutting tool has also been developed which is prepared by brazing vapor-deposited diamond to a tool substrate. For example, each of Japanese Patent Laying-Open Nos. 1-153228 (1989) and 1-210201 (1989) discloses a technique of brazing a thick film of vapor-deposited diamond as a cutting edge to a tool substrate of cemented carbide for providing a cutting tool. Such a tool suffers no problems of separation of the diamond film, dissimilarly to the diamond-coated tool, and is superior in performance to the conventional tool employing sintered diamond.

A cutting tool having a cutting edge member of vapor-deposited polycrystalline diamond is superior in strength, wear resistance and heat resistance to a conventional tool employing a diamond sintered body. Also in such a cutting tool employing vapor-deposited diamond, a brazing filler metal having a melting point of about 650° C. is employed in order to braze the cutting edge member to a tool substrate, similarly to the tool employing a diamond sintered body. In this case, the cutting tool employing vapor-deposited diamond is easily exposed to thermal damage. Namely, the brazing layer can be damaged by the heat generated from the cutting edge during cutting, very easily as compared with the tool employing sintered diamond, since the vapor-deposited diamond has higher thermal conductivity than the diamond sintered body. When the brazing layer is softened by heat and deformed during cutting, the cutting edge of vapor-deposited diamond is chipped.

Furthermore, when a sharp cutting edge having a wedge angle of not more than 65° is formed in a diamond tool which is manufactured by brazing vapor-deposited diamond to a tool substrate, the cutting edge is easily chipped if high stress or an impact load is applied to the cutting edge during intermittent cutting or cutting of hard ceramics.

SUMMARY OF THE INVENTION

An object of the present invention is to provide a diamond cutting tool having a cutting edge which is easy to braze with a brazing filler metal and has a brazing material which is hardly damaged by heat.

Another object of the present invention is to provide a diamond cutting tool having high strength and excellent durability.

The diamond cutting tool according to the present invention comprises a tool substrate, and a cutting edge member, which is provided on the tool substrate, containing vapor-deposited polycrystalline diamond.

According to an aspect of the present invention, the cutting edge member includes three layers. The first layer consists essentially of vapor-deposited polycrystalline diamond, and forms a rake face of a cutting edge. The second layer, which is formed on the first layer, consists essentially of at least either a metal or ceramics having a linear expansion coefficient between that of the tool substrate and that of the diamond or closer to that of the substrate than the diamond, and vapor-deposited polycrystal diamond. The third layer, which is formed on the second layer, consists essentially of at least either a metal or ceramics. The cutting edge member having such a laminate structure is brazed to the tool substrate through the third layer.

A method for manufacturing such a diamond cutting tool comprises a step of forming a diamond layer on a base material by vapor deposition. Then diamond is deposited on the diamond layer by vapor deposition while supplying powder of at least either a metal or ceramics having a thermal expansion coefficient between that of the tool substrate and the diamond or closer to that of the substrate than the diamond, in a vapor phase. Then such synthesis of the diamond is stopped and at least either the metal or the ceramics is deposited. Next, the method includes a step of separating or removing the base material for obtaining a cutting edge member having a laminate structure, and a step of brazing the cutting edge member to a tool substrate so that a surface of the diamond layer which has been in contact with the base material defines a rake face.

According to another aspect of the present invention, a cutting edge member which is provided on a tool substrate comprises a portion defining a rake face of a cutting edge and consisting essentially of a diamond composite material. This diamond composite material consists essentially of particles or fibers consisting essentially of at least one material selected from the group consisting of Si, B, Ge and transition metals belonging to the groups IVa, Va and VIa of the periodic table, oxides, nitrides, carbides, carbo-nitrides and borides of B, Al, Si and transition metals belonging to the groups IVa, Va and VIa of the periodic table, and diamond, and vapor-deposited polycrystalline diamond strongly bonding the particles or fibers.

A method for manufacturing such a diamond cutting tool comprises a step of preparing a base material having a mirror-finished surface. The next step is one of depositing diamond on the surface by vapor deposition while supplying the surface with particles or fibers consisting essentially of at least one material selected from the group consisting of Si, B, Ge and transition metals belonging to the groups IVa, Va and VIa of the periodic table, oxides, nitrides, carbides, carbo-nitrides and borides of B, Al, Si and transition metals belonging to the groups IVa, Va and VIa of the periodic table, and diamond. The method next includes a step of separating or removing the base material thereby obtaining a diamond composite material consisting essentially of the aforementioned material and polycrystalline diamond strongly bonding the material. Finally the method includes brazing the diamond composite material to a tool substrate so that a surface of the diamond composite material having been in contact with the base material defines a rake face of a cutting edge.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

According to the present invention, various low-pressure vapor deposition methods are applicable to the formation of diamond by vapor deposition. For example, a method of decomposing and exciting a raw material gas with a thermal filament or plasma discharge and a film forming method employing a combustion flame are useful for vapor deposition of diamond. In vapor deposition, a raw material gas can be prepared from a gas which is mainly composed of hydrocarbons such as methane, ethane or propane, alcohol such as methanol or ethanol or an organic carbon compound such as an ester, and hydrogen. In addition, the raw material can contain inert gases such as argon, oxygen, carbon monoxide and water, in a range not inhibiting synthesis of diamond and its characteristics.

According to the present invention, the tool substrate may be prepared from a heat resistant composite material such as cemented carbide or cermet, a heat resistant alloy such as cast iron or a super alloy, steel such as high-speed steel, or the like.

In the diamond cutting tool comprising a tool substrate and a cutting edge member having a three-layer structure which is provided on the tool substrate, the metal contained in the cutting edge member can be Mo, W, Cr, V, Nb, Ta, Co, Ni or Fe, for example, while the ceramics can be cBN, SiC, $Si_3N_4$, WC, BN, TiC, TaC, NbC, $Cr_3C_2$, $Mo_2C$, VC or TiN, for example. As to such materials, proper ones are preferably appropriately selected or combined with each other in consideration of adhesion to diamond and to the tool substrate, as well as a desirable linear expansion coefficient. SiC, $Si_3N_4$, WC, BN, W and Mo are more preferable as to adhesion to the vapor-deposited diamond, while cBN, SiC, $Si_3N_4$, WC, hBN, W and Mo are excellent in adhesion to diamond in this order. As to adhesion to the tool substrate of the aforementioned material, on the other hand, Mo, W, WC, TiC, Cr, Co, Ni and Fe are preferable, depending on the type of the tool substrate. Thus, it is preferable to introduce a large amount of Mo, W, WC, TiC, Cr, Co, Ni or Fe into a portion of the cutting edge which is closer to the tool substrate, for example, while introducing a large amount of cBN, SiC, $Si_3N_4$, WC, BN, W or Mo into another portion of the cutting edge closer to the diamond layer. The SiC, $Si_3N_4$, W and Mo are preferably used together with the tool substrate of a cemented carbide.

The cutting edge having a three-layer structure is brazed to the tool substrate. A brazing filler metal for such brazing can be prepared from soft solder having a brazing temperature of about 250° to 450° C. or silver solder, corresponding to JIS B Ag-3, having a brazing temperature of about 600° to 700° C., for example.

The brazing can preferably be performed through a metallization layer which is formed of a metal or semimetal element belonging to the groups IIIb, IVa, IVb, Va, Vb, VIa, VIb, VIIa and VIII of the periodic table, or a compound thereof.

The cutting edge having a three-layer structure can have a thickness of about 20 to 5000 µm, more preferably about 100 to 1000 µm. When producing the cutting edge member of this invention, vapor deposition of the first layer (diamond layer) is started from a surface of the base material. When the cutting edge member is brazed to the tool substrate so that the surface of the diamond layer having been in contact with the base material defines a rake face, the maximum amount of diamond having the minimum crystal grain diameter is present in the rake face of the diamond layer. The thickness of the first layer is preferably at least about 40 µm, and more preferably at least about 70 µm. The second layer (composite layer) preferably has a thickness of about 10 to 300 µm, more preferably about 30 to 100 µm. In the second layer, the diamond content can be about 0.5 to 99 percent by volume, for example, while the content of the metal or ceramics can be about 1 to 99.5 percent by volume, for example. Further, the diamond content is more preferably inclined to be successively reduced toward the third layer. The third layer consisting essentially of a metal or ceramics preferably has a thickness of about 50 to 2000 µm, and more preferably about 100 to 1000 µm, for example.

According to the present invention, it is possible to provide a tool comprising a cutting edge member having a twisted shape such as a helical flute, which is brazed to a tool substrate. Such a tool is applicable to various milling cutters and drills. In the aforementioned cutting tool, the rake face is preferably so smooth that its surface roughness $R_{max}$ is not more than about 0.2 µm, for example.

In manufacturing the cutting edge member having a three-layer structure, the base material on which the diamond layer (first layer) is to be formed is preferably prepared from Si, Mo or the like, for example. Such a base material can be separated from the diamond layer by separation or dissolution through machining or chemical treatment. The surface of the base material to be provided with the diamond layer is preferably mirror-finished so that its surface roughness $R_{max}$ is not more than about 0.2 µm.

The diamond layer can be formed to a thickness of at least about 40 µm, more preferably at least about 70 µm, for example. The metal powder or ceramics powder supplied in the vapor phase can be prepared from the aforementioned material. The particle diameter of such powder is preferably about 0.1 to 150 µm, and more preferably about 0.2 to 60 µm, for example. This powder can be supplied into a flow of the raw material gas which is employed for vapor deposition of the diamond, so as to deposit onto the base material with the diamond. In this case, the powder may be in a temporarily completely melted state, a semi-melted state, or an unmelted state. Formation of a film while supplying the powder in such a manner, which can be carried out by well-known CVD, for example, is preferably carried out in accordance with a spraying process employing high-temperature plasma CVD. This is because it is possible to easily supply the powder in a melted, semi-melted or unmelted state by changing the position of the point of supply of the powder, since a high-temperature plasma jet has a temperature distribution. When the particle size of the supplied powder is varied, it is possible to similarly control the state of the powder by the change of its thermal capacity. When the diamond is deposited with the aforementioned supply of the powder, a composite layer (second layer) is so formed as to contain the metal or ceramics and the diamond in a mixed state. The thickness of such a composite layer is preferably about 10 to 300 µm, more preferably about 30 to 100 µm.

The layer of a metal or ceramics deposited on the composite layer, which can be formed by well-known evaporation or sputtering, for example, can preferably be formed by continuing the aforementioned spraying process. The layer of a metal or ceramics formed in such a manner can have a thickness of about 50 to 2000 µm, more preferably about 100 to 1000 µm.

The deposit formed in the aforementioned manner is separated by dissolution/removal of the base material or the like. The deposit may be worked with a laser in advance of such separation, or laser-worked into a prescribed shape after the separation. When the aforementioned powder contains a material which is dissolved in dissolution/removal of the base material, it is necessary to prevent the layer containing a metal or ceramics from contact with the solution by covering the deposit with a protective film, for example. The aforementioned cutting edge member having a multilayer structure can be subjected to cutting edge treatment such as honing or formation of a negative land after brazing and preparing an edge.

In the cutting edge member having a three-layer structure, the rake face consisting essentially of polycrystalline diamond provides the tool with excellent heat resistance, wear resistance and chipping resistance. Particularly when a diamond layer whose vapor deposition is started from a rake face side is employed, the rake face has a fine structure in the initial stage of growth, and is formed of diamond crystals having the minimum particle diameter in the diamond layer. The rake face formed of such a fine structure is particularly excellent in wear resistance and chipping resistance.

Additional important parts are the second layer which is formed following the first layer, and the third layer which is formed following the second layer. The second layer contains a metal or ceramics and diamond in a mixed state, while the third layer consists essentially of a metal or ceramics. The metal and/or the ceramics forming these layers have a smaller thermal conductivity than diamond. Thus, these layers are less able to transfer heat as compared with the diamond layer. In this cutting tool, the cutting edge is brazed through the third layer, whereby heat which is generated in the first layer (diamond layer) of the cutting edge during cutting is transferred to a brazing layer through the second and third layers. Since the second and third layers are less able to transfer heat as compared with diamond, the heat generated in the cutting edge is hardly transferred to the brazing layer as compared with the conventional tool having a cutting edge which is formed of only diamond. Thus, the brazing layer is hardly exposed to thermal damage. Due to employment of such a cutting edge having a multilayer structure, it is possible to avoid the problem that the brazing filler metal is deformed by softening during cutting, whereby the diamond cutting edge becomes chipped. In addition, the metal and/or the ceramics forming the second and third layers have a linear expansion coefficient which is between that of the tool substrate and diamond or is closer to that of the substrate than the diamond.

Further, the cutting edge is brazed through the third layer. Because a portion of the cutting edge involved in brazing is formed of a material having a linear expansion coefficient which is closer to that of the tool substrate, it is possible to remarkably suppress thermal stress caused by differences in linear expansion coefficient, as compared with the case of directly brazing diamond onto a tool substrate. Due to such reduction of the thermal stress, it is possible to prevent the cutting edge from breaking by thermal shock, whereby a cutting tool having superior durability can be provided. Particularly when a cutting edge having a complicated shape such as a helical flute is brazed, it is possible to effectively suppress deformation of the cutting edge during brazing by suppressing the thermal stress as described above, so that the effect of this invention will be more significant in this case.

Further, the second layer is adapted to suppress heat conduction as described above, as well as to strongly bond the third layer, which is suitable for brazing, with the diamond layer. If this second layer is not provided, the diamond layer forming the cutting edge is easily separated, leading to inferior durability of the cutting tool. In manufacturing a diamond material generally forming a cutting edge, the diamond will be deformed during removal of a base material when the diamond material formed on the base material is small in thickness. Such deformation is particularly problematic in manufacturing a cutting edge, such as a helical flute, other than a flat plate. The thickness of the diamond material may be increased in order to avoid such a problem, while such a thick diamond material is increased in cost. According to the present invention, the cost for the cutting edge can be reduced by forming a cutting edge containing diamond and other low-priced material in a mixed state and the diamond layer forming the rake face is strongly supported, while the cutting edge is remarkably inhibited from deformation caused by thermal stress or the like.

When the second layer is deposited on the first layer, the powder of a metal or ceramics may be in a melted, semi-melted or unmelted state. When the powder is unmelted, diamond can be grown from nuclei of particles forming the powder, so that a composite layer containing vapor-deposited diamond serving as a binder can be obtained. In this composite layer, adhesion between diamond and the powder particles is excellent. After formation of the second layer, synthesis of the diamond is stopped so that a layer of a metal or ceramics is formed on the second layer. The deposit of the three layers is separated from the base material, and brazed to a tool substrate as a cutting edge member. In such brazing, a surface of the diamond layer having been in contact with the base material defines a rake face. Therefore, the brazing is carried out through the layer of a metal or ceramics.

When the surface of the base material on which the diamond layer is to be deposited is first smoothed, it is possible to obtain a smooth rake face by such brazing through the surface opposite the crystal growth start surface. The surface of the diamond layer having been in contact with the base material has a fine structure which is excellent in wear resistance and chipping resistance as hereinabove described, since vapor deposition has been started from this portion. Then, the cutting edge member having lower thermal conductivity than a conventional diamond cutting edge is brazed to the tool substrate. When a base of cemented carbide is employed, it is possible to suppress thermal damage to the brazing layer during cutting even if a brazing filler metal having a melting point of about 650° C. is employed, similarly to the prior art. The brazing can easily be carried out with no special requirements for specific conditions or considerations.

According to still another aspect of the present invention, a material which is to be composed together with vapor-deposited diamond can be in the form of powder, fibers, or a mixture thereof. When a powder material is employed, its mean particle diameter is preferably not more than about 200 μm, more preferably about 1 to 50 μm. When a fibrous material is employed, on the other hand, its diameter is preferably not more than about 200 μm, more preferably about 1 to 50 μm. Transition metals belonging to the groups IVa, Va and VIa of the periodic table, from which a preferable component of the aforementioned material is selected, include Ta, Mo and W. Further, oxides, nitrides, carbides, carbonitrides and borides of Al, Si and transition metals belonging to the groups IVa, Va and VIa of the periodic table, from which a preferable component is selected, include AlN, BN, $B_4C$, SiC, $Si_3N_4$, TiC, TiN, Ti(CN), $TiB_2$, $Mo_2C$, TaC, NbC, VC and WC. The tool substrate can be prepared from a heat-resistant alloy such as cemented carbide, cast iron or a super alloy, steel or the like. Cemented carbide, which is excellent in high-temperature strength and wear resistance, is particularly preferable as a tool substrate material. In this tool, the portion defining a rake face by the diamond composite material can have a thickness of about 10 to 3000 μm.

According to the present invention employing a diamond composite material, it is possible to preferably compose particles of cubic BN having a clearly appearing (111) crystal plane with polycrystalline diamond. In this case, it is possible to provide a cutting edge member having a principal crystal plane, which is oriented substantially in parallel with the rake face, formed by the (111) plane. A portion of the polycrystalline diamond having the (111) plane oriented as described is preferably formed up to a depth of at least about 10 μm, more preferably at least 50 μm, from the rake face of the cutting edge, for example. In this case, the cubic BN powder preferably has a mean particle diameter of about 1 to 30 μm.

The diamond composite material can be brazed to a tool substrate. The brazing is preferably carried out through a metallization layer consisting of any one of metals or semi-metals belonging to the groups IIIb, IVa, IVb, Va, Vb, VIa, VIb, VIIa and VIII of the periodic table, or compounds thereof.

The base material to be provided with the diamond composite material is preferably prepared from Si or Mo, for example. Further, the surface of the base material on which the composite material is to be formed is preferably mirror-finished so that its surface roughness $R_{max}$ is not more than 0.2 μm, and this surface is more preferably ground or polished with diamond powder. Depending on the size and the amount of the as-supplied powder or fibers and the deposition rate of the diamond, a slight clearance may be defined between the surface of the base material and the diamond composite layer. The surface roughness $R_{max}$ may exceed 0.2 μm in a portion of the diamond composite material being in contact with the base material surface. In this case, the powder or the fibers are preferably not supplied in an initial stage, but rather they are supplied only after formation of a diamond thin film. The base material can be separated or removed from the diamond composite material by separation or dissolution through machining, chemical treatment or the like. The thickness of the diamond composite material is preferably about 10 to 3000 μm, more preferably about 200 to 500 μm, for example. The as-obtained diamond composite material may be worked to a proper size by cutting or the like, or may be used in the size as it is. The as-obtained diamond composite material is brazed to a tool substrate. In such brazing, the surface of the diamond composite material having been in contact with the base material, i.e., a crystal growth start surface, defines a rake face of the cutting edge. Therefore, a surface which is opposite to the said surface, i.e., a crystal growth end surface, generally defines a brazing surface. This brazing surface is preferably formed with the aforementioned metallization layer in advance of the brazing. The brazing can be effectively carried out through the metallization layer. However, such metallization is not necessarily required in the case of an activated brazing filler metal containing Ti or the like.

When cubic BN powder having a clearly appearing (111) crystal plane with a relatively large area is employed in order to prepare the diamond composite material, it is possible to deposit diamond by vapor deposition while supplying the powder to direct its (111) plane substantially in parallel with the mirror-finished base material surface so that the (111) plane of the cubic BN is oriented substantially in parallel with the base material surface.

In this case, it is possible to form polycrystalline diamond whose (111) plane is strongly oriented in parallel with the base material surface by dispersing the cubic BN powder on the base material surface so that its (111) plane is in parallel with the base material surface. At this time, the as-supplied cubic BN powder is preferably about 1 to 30 μm in mean particle diameter. In the aforementioned CVD, further, it is possible to strongly orient the (111) plane by relatively reducing carbon concentration (with respect to gaseous hydrogen, for example). In the diamond composite material which is brazed to the tool substrate, a portion having the (111) plane oriented as described is preferably formed up to a depth of at least about 20 μm, more preferably at least about 50 μm, from the rake face.

In the cutting edge of the cutting tool employing a diamond composite material, at least a portion up to a certain depth from the rake face is formed by a dense hard polycrystalline substance in which particles or fibers of the aforementioned material are strongly bonded to each other through the vapor-deposited diamond as deposited. This portion, which is a bond structure of homogeneous microcrystals due to growth of the diamond from nuclei of particles or fibers, is extremely different from a columnar crystal structure which is attained by growing only diamond. When a material which is higher in thermal expansion coefficient than diamond is homogeneously mixed into the diamond, compression stress is homogeneously applied to the diamond so that it is possible to obtain a strong composite material. Thus, the rake face which consists essentially of a diamond composite material is higher in strength, and superior in wear resistance and chipping resistance. A tool having such a rake face is superior in durability.

When cubic BN particles having an oriented (111) plane are employed, it is possible to vapor-deposit diamond by arranging the particles so that the (111) plane is oriented substantially in parallel with the base material surface. In this case, the (111) crystal plane of the diamond defines a principal crystal plane of the composite material, which crystal plane is oriented substantially in parallel with the rake face. Since the diamond is heteroepitaxially grown with respect to the BN particles, the BN particles are more strongly bonded to each other in the rake face of the cutting edge. Such a tool has high strength, and is excellent in wear resistance since the (111) crystal plane, having the highest hardness in the diamond, is oriented in the rake face.

Further, the tool whose cutting edge is formed of a composite material of cubic BN and diamond can also be applied to cutting of a ferrous material, due to the BN contained therein. On the other hand, a tool whose cutting edge is formed of only diamond cannot be applied to cutting of a ferrous material, although the same is adapted to cut a non-ferrous metal such as an Al alloy or a Cu alloy. This is because the diamond undergoes a chemical reaction of conversion to non-diamond carbon upon cutting of a ferrous material. However, the inventive tool can simultaneously work an Al alloy and a ferrous material, for example, to satisfy a requirement for so-called co-cutting.

In preparing the diamond composite material, it is possible to increase the growth rate of the diamond composite material by growing the diamond from nuclei of the particles or fibers. While each of the following Examples refers to particles which are supplied to a base material surface in an unmelted state, such particles or fibers can be in any of a melted, semi-melted or unmelted state depending on the type of the material to be supplied to a base material. It is possible to reduce generation of residual stress and form a strong material in a shorter time by composing the particles or fibers with the diamond. When powder of cubic BN having a clearly appearing (111) crystal plane is employed and placed on the base material so that the (111) plane is substantially in parallel with the base material surface for vapor-depositing diamond, it is possible to enable heteroepitaxial growth of diamond strongly orienting the (111) plane. This method enables vapor phase growth of diamond strongly orienting the (111) plane substantially in parallel with the base material surface at a higher rate. A tool having a rake face on which a (111) plane of diamond is oriented is excellent in durability, as hereinabove described. Further, it is possible to manufacture a cutting edge member which is excellent in durability in a shorter time by carrying out the aforementioned process.

When a diamond composite material is formed on a mirror-finished base material surface, a surface of the composite material having been in contact with the base material is also in the form of a mirror finished surface, obtained by separating or removing the base material. This surface may not need to be polished, or may be only simply polished if necessary. Even when the hardest (111) plane of the diamond, which is hard to polish, is oriented on the rake face, therefore, it is possible to provide a rake face having sufficiently low surface roughness. When the diamond composite material is provided on the tool substrate as a cutting edge member, it is possible to obtain a tool which is excellent in durability and capable of cutting both ferrous and nonferrous materials.

The present invention is now described with reference to preferred Examples.

Figure 1:
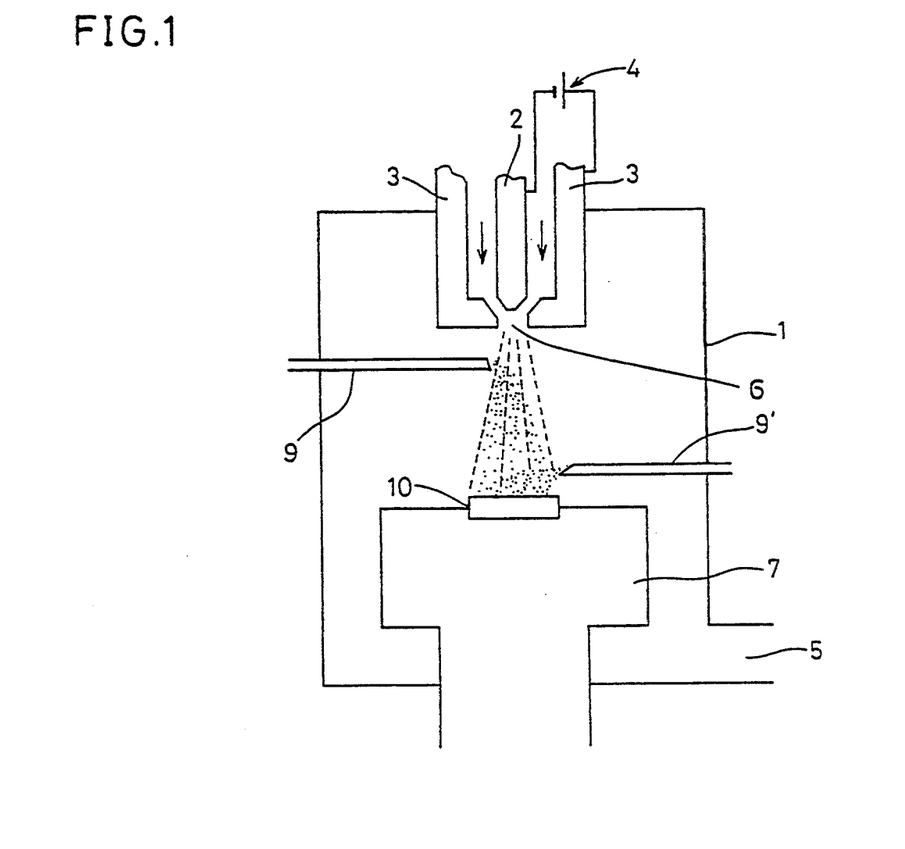
FIG. 1 is a model diagram showing an apparatus for manufacturing a cutting edge according to the present invention.

FIG. 1 shows an apparatus for forming a cutting edge having a multilayer structure, in order to manufacture a diamond cutting tool according to the present invention. A method of manufacturing the cutting tool according to the present invention is now described with reference to FIG. 1. The apparatus shown in FIG. 1 is adapted to carry out high-temperature plasma CVD, and comprises a vacuum chamber 1, being exhaustible though an exhaust port 5. The chamber 1 is provided therein with a cathode 2 and an anode 3 for discharge. A power source 4 applies a dc voltage across the cathode 2 and the anode 3. A raw material gas for synthesizing diamond is supplied through the cathode 2 and the anode 3 as shown by arrows in FIG. 1, to generate decomposed and excited plasma by discharge at a supply port 6 therefor. In a series of operations from such generation of plasma to formation of diamond, the interior of the vacuum chamber 1 is maintained at a low pressure.

The as-generated plasma strikes a surface of a base material 10, which is provided in the path of the plasma and set in a holder 7, to grow diamond. Thus, a diamond layer is deposited to reach a proper thickness. Then, powder of a metal or ceramics is supplied in a vapor phase through a nozzle 9 or 9' simultaneously with continuing growth of the diamond, so that a layer containing the metal or ceramics and the diamond in a mixed state is formed on the diamond layer. At this time, it is possible to deposit the powder in a melted, semi-melted or unmelted state on the diamond layer by adjusting the position of the nozzle 9 or 9' for supplying the powder. When this layer reaches a proper thickness, the supply of the powder of at least either the metal or ceramics is stopped and at least either the metal or ceramics is melted to attain a prescribed composition, and deposited.

EXAMPLE 1

An Si base material 1 inch in diameter, which was mirror-finished to be not more than 0.05 $\mu$m in surface roughness $R_{max}$, was employed to form a diamond layer of polycrystalline diamond to a thickness of about 100 $\mu$m by well-known high-temperature plasma CVD using the aforementioned apparatus. This diamond layer was formed under the following conditions:

Raw Material Gas (Flow Rate): CH$_4$ 40 ml/min., Ar 4000 ml/min., H$_2$ 2000 ml/min.
Pressure: 200 Torr
Substrate Temperature: 900° C.
Discharge Voltage: 120 V
Discharge Current: 90 A Then, ceramics and a metal were supplied under the aforementioned conditions by a method of decrementing the supply of SiC of 8 to 16 $\mu$m in particle diameter from 5 mg/min. to 1 mg/min. in two hours and incrementing the supply of W of 2 to 3 $\mu$m in particle diameter from 1 mg/min. to 10 mg/min., to form a diamond composite layer having a thickness of about 100 $\mu$m. In this formation of the diamond composite layer, W and SiC were independently supplied onto the diamond layer in a melted state from the upper nozzle 9 and in an unmelted state from the lower nozzle 9' respectively. Then, the supply of CH$_4$ was stopped in the aforementioned conditions and W of 2 to 3 $\mu$m in particle diameter was supplied at a rate of 100 mg/min., melted and then deposited on the diamond composite layer. The as-formed W layer was about 200 $\mu$m in thickness.

Figure 2:
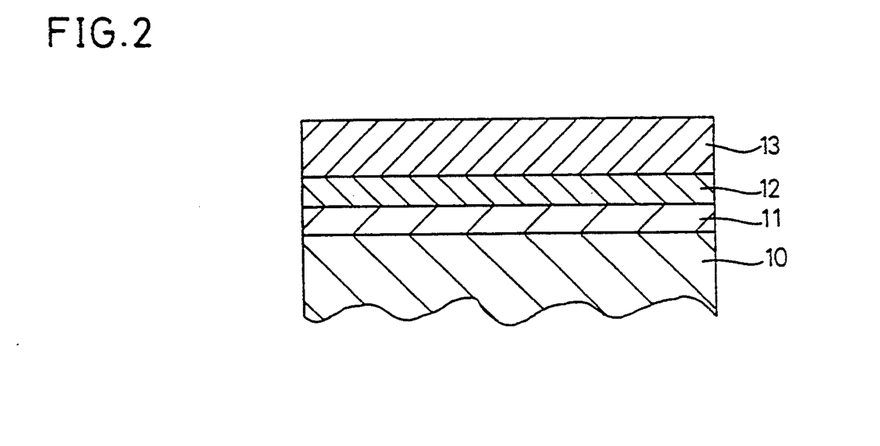
FIG. 2 is a sectional view showing a cutting edge member having a laminate structure formed according to the present invention.

FIG. 2 shows the as-prepared material having a multilayer structure. A diamond layer 11 is formed on a base material 10 in a thickness of about 100 $\mu$m, and a diamond composite layer 12 consisting essentially of W, SiC and diamond in a mixed state is formed on the diamond layer 11 in a thickness of about 100 $\mu$m. Further, a W layer 13 is formed on the diamond composite layer 12 in a thickness of about 200 $\mu$m.

Then, the material having a multilayer structure was masked to protect the as-formed layers against erosion by acid, and thereafter the Si base material was dissolved and removed by fluoronitric acid, to obtain a cutting edge member having the multilayer structure. Thereafter this member was laser/worked into proper dimensions and a proper shape as a cutting edge. Ni was metallized on the W layer of the as/obtained cutting edge member in a thickness of 2 $\mu$m, so that the cutting edge member was brazed to a base of cemented carbide (SPG 422) with a brazing filler metal corresponding to JIS B Ag-3, through the surface provided with the metallization layer serving as a bonding plane.

Figure 3:
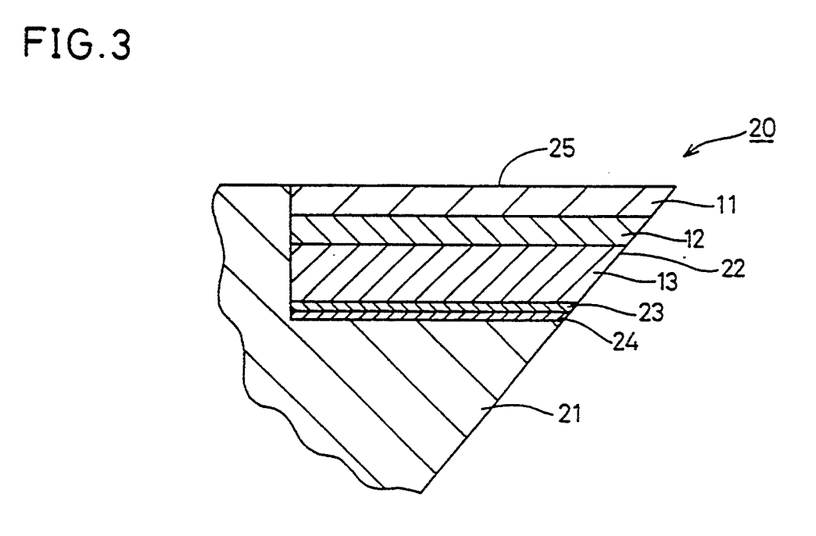
FIG. 3 is a sectional view showing a principal part of a cutting tool having a tool substrate to which a cutting edge member having a laminate structure according to the present invention is brazed.

FIG. 3 shows a principal part of the as-obtained diamond cutting tool 20. In this diamond cutting tool 20, a cutting edge 22 is fixed to a prescribed region of a base 21 of cemented carbide through a metallization layer 23 and a brazing layer 24. In the cutting edge 22, a rake face 25 is formed by a diamond layer 11. In the cutting edge 22, further, a diamond composite layer 12 is formed in continuation to the diamond layer 11, while a W layer 13 is formed in continuation to the diamond composite layer 12.

The W layer 13 is bonded to the base 21 through the metallization layer 23 and the brazing layer 24. In this tool, the rake face 25 formed by the diamond layer exhibited surface roughness $R_{max}$ of 0.08 m.

COMPARATIVE EXAMPLE

On the other hand, the same apparatus as that for the aforementioned Example was employed to form a diamond layer of 400 $\mu$m in thickness on the same type of Si base material, under the following conditions:

Raw Material Gas (Flow Rate): CH$_4$ 40 ml/min., Ar 4000 ml/min., H$_2$ 2000 ml/min.
Pressure: 200 Torr
Substrate Temperature: 900° C.
Discharge Voltage: 120 V
Discharge Current: 90 A Then, the diamond material formed under the aforementioned conditions was laser-worked into proper dimensions and a proper shape as a cutting edge, and thereafter the Si base material was dissolved and removed by fluoronitric acid, to obtain a diamond material. Ti and Ni were successively stacked on a crystal growth end surface of the as-obtained diamond material in thicknesses of 1 $\mu$m and 2 $\mu$m respectively, and thereafter the diamond material was brazed as a cutting edge to a base of cemented carved (SPG 422) with a brazing filler metal corresponding to JIS B Ag-3 in a similar manner to the above at 650° C., through the surface provided with the metallization layer serving as a bonging plane. In the as-obtained cutting tool, a cutting edge formed of only vapor-deposited diamond was brazed to the base of cemented carbide.

In order to evaluate the performance of the diamond cutting tools prepared in the aforementioned methods, cutting tests were made at two cutting speeds under the following conditions:

Workpiece: A390—T6 (Al—17% Si alloy)
Cutting Speed: 300 m/min., 800 m/min.
Depth of Cut: 0,5 mm
Feed Rate: 0.1 mm/rev.
Coolant: water-soluble oil solution Table 1 shows the results of the tests made on the diamond cutting tools prepared according to the above inventive Example and the comparative example. It was clear that the cutting edge of the comparative example, which was formed of only diamond, was chipped in a relatively short time due to softening of the brazing filler metal under high-speed cutting conditions which increased the cutting edge temperature. Hence this cutting edge was inferior in practicability. On the other hand, the inventive cutting tool exhibited excellent cutting performance with no softening of the brazing filler metal upon long-time use.

TABLE 1

| | Flank Wear Width (mm) | | | | |
|---|---|---|---|---|---|
| | Cutting Speed: 300 m/min. | | Cutting Speed: 800 m/min. | | |
| | 5 min. | 60 min. | 5 min | 10 min. | 60 min. |
| Example | 14 | 38 | 22 | 38 | 78 |
| Comparative Example | 16 | 37 | 23 | Chipped | — |

According to the present invention, as hereinabove described, it is possible to braze a cutting edge whose rake face is formed of vapor-deposited diamond to a tool substrate with a brazing filler metal having a low melting point, similarly to the prior art. The cutting edge can be easily brazed. It is possible to suppress generation of thermal stress from such brazing, due to the second and third layers forming the cutting edge. Further, the second and third layers have lower thermal conductivity as compared with the diamond layer, whereby heat which is generated during cutting work is transferred to the brazing layer much less or hardly at all as compared with the conventional cutting tool whose cutting edge is formed of only diamond. Thus, the brazing layer is hardly damaged by heat during cutting work. The diamond cutting tool having the aforementioned excellent performance is particularly useful for a cutting tool having a complicated shape such as a helical flute, which may be disadvantageously deformed by Thermal stress caused in brazing if it has the prior art structure, or for a cutting tool employed for working a material which is hard to cut.

EXAMPLE 2

Figure 4:
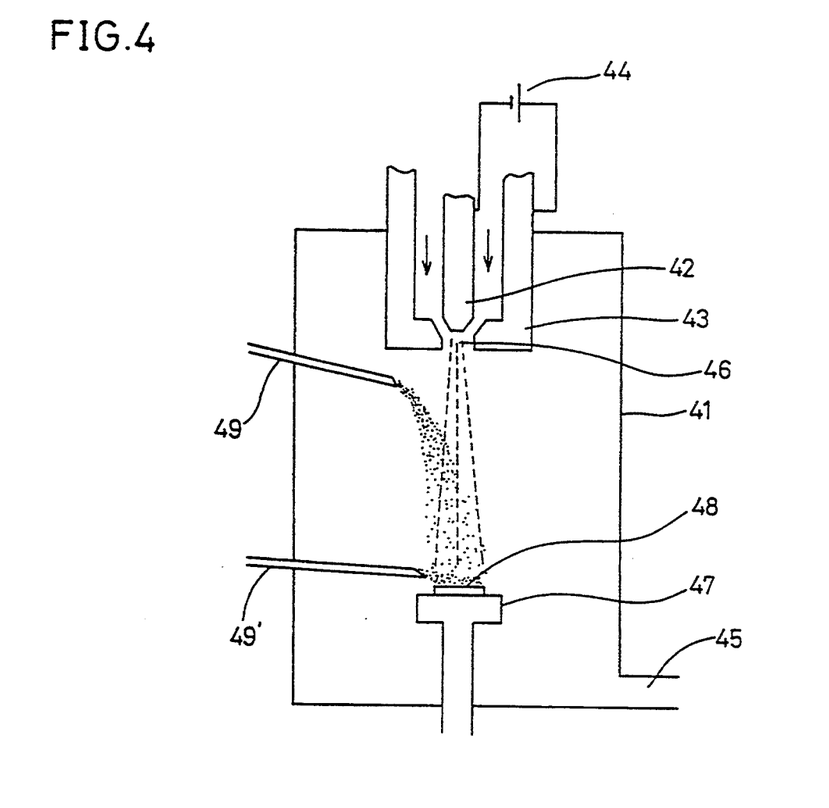
FIG. 4 is a model diagram showing an apparatus for manufacturing a diamond composite material employed in the present invention.

FIG. 4 shows an apparatus for forming a diamond composite material which is used as a cutting edge in manufacturing a diamond cutting tool according to the present invention. The apparatus shown in FIG. 4, which is a DC arc plasma jet CVD apparatus employing a DC arc plasma jet for decomposing/activating a raw material gas, comprises a vacuum chamber 41 being exhaustible through an exhaust port 45, and a cathode 42 and an anode 43 provided in the chamber for discharge. A power source 44 applies a dc voltage across the cathode 42 and the anode 43. A raw material gas for synthesizing diamond is supplied through the cathode 42 and the anode 43 as shown by arrows in FIG. 4, and decomposed/excited by discharge in a supply port 46 of the cathode and anode, to generate plasma. In a series of operations from such generation of plasma to formation of diamond, the interior of the vacuum chamber 41 is maintained at a low pressure. The as-generated plasma strikes a surface of a substrate 48, which is provided in the path of the plasma's movement and set on a cooling support 47, to grow diamond. Simultaneously with such growth of the diamond, fine powder of a metal or ceramics is supplied onto the substrate 48 through a nozzle 49 or 49' for supplying powder or fibers, so that a layer containing the metal or ceramics and the diamond in a mixed state is formed on the substrate surface. Thus, it is possible to form a diamond composite material having a proper thickness. The support 47 is vibrated so that the powder or fibers homogeneously spread on the substrate surface, although a particular vibration means is not shown in FIG. 4.

In the apparatus having the aforementioned structure, Si substrates of 1 in. in diameter, which were mirror-finished to be not more than 0.1 μm in surface roughness $R_{max}$, were employed and ground or polished with diamond powder of grit #10000, so that diamond composite materials were formed thereon under conditions shown in Table 2 respectively. Under the conditions shown in Table 2, powder materials and fibers were supplied from the nozzle 49', so that the same were not melted by plasma jet flames.

TABLE 2

| Sample | Raw Material Gas CH$_4$/H$_2$/Ar (L/min.) | Pressure (Torr) | Temperature of Base Material Surface (°C.) | Base Material | Supplied Material | Size of Supplied Material (μm) | Amount of Supply (mg/min.) | Thickness Composite Layer (μm) | Total Thickness (μm) | Deposition Time Composite Layer (hr) | Total Thickness (hr) | Supplied Power (KW) | Remarks |
|---|---|---|---|---|---|---|---|---|---|---|---|---|---|
| 1 | 0.03/2/5 | 200 | 950 | Si | SiC Powder | 8–16 | 1.2 | 150 | 500 | 2.0 | 11.0 | 8.3 | |
| 2 | 0.04/2/5 | 250 | 1000 | Si | SiC Powder | 20–30 | 1.5 | 250 | 1000 | 2.5 | 17.5 | 9.5 | |
| 3 | 0.02/2/5 | 150 | 900 | Si | SiC Whisker | φ5 × 50 | 0.7 | 100 | 400 | 2.5 | 12.5 | 7.2 | |
| 4 | 0.02/2/5 | 150 | 900 | Si | Si$_3$N$_4$ Whisker | φ5 × 50 | 0.7 | 100 | 400 | 2.5 | 12.5 | 7.2 | |
| 5 | 0.03/2/5 | 200 | 950 | Si | SiC + Si$_3$N$_4$ Powder | φ2 × 30 3–8 | 0.4 0.3 | 150 | 500 | 2.5 | 11.5 | 8.3 | |
| 6 | 0.02/2/5 | 150 | 900 | Si | c-BN Powder | 3–8 | 0.7 | 100 | 400 | 2.0 | 12.0 | 7.2 | |
| 7 | 0.03/2/5 | 200 | 950 | Si | c-BN Powder | 3–8 | 0.9 | 150 | 500 | 2.5 | 11.5 | 8.3 | |
| 8 | 0.03/2/5 | 200 | 950 | Si | c-BN Powder | 8–16 | 1.2 | 150 | 500 | 2.0 | 11.0 | 8.3 | |
| 9 | 0.04/2/5 | 250 | 1000 | Si | c-BN Powder | 20–30 | 1.5 | 250 | 1000 | 2.5 | 17.5 | 9.5 | |
| 10 | 0.03/2/5 | 200 | 950 | Si | None | | 0 | 0 | 500 | | 12.5 | 8.3 | Comparative Example |

Then, the Si substrates were dissolved and removed by fluoronitric acid, to obtain diamond composite materials respectively.

Figure 5:
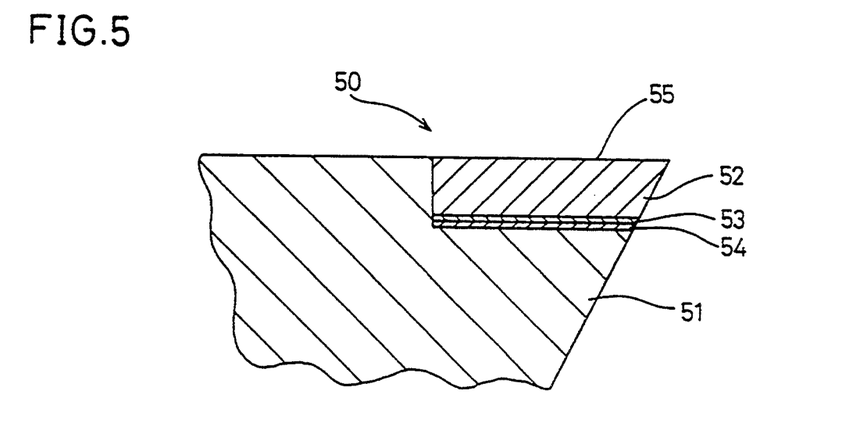
FIG. 5 is a sectional view showing an embodiment of a cutting tool employing a diamond composite material according to the present invention.

The as-obtained diamond composite materials were cut with a laser into dimensions required for cutting edges, and thereafter Ti and Ni were successively stacked on crystal growth end planes in thicknesses of 1 μm and 2 μm respectively. Then the composite materials were vacuum-brazed to bases of cemented carbide (SPG 422) with a brazing filler metal, mainly composed of Cu and having a melting point of 1100° C., through surfaces provided with such metallization layers serving as bonding planes respectively. FIG. 5 shows a principal part of each of the as-obtained diamond cutting tools. In this diamond cutting tool 50, a cutting edge 52 of a diamond composite material is fixed to a prescribed region of a base 51 of cemented carbide through a metallization layer 53 and a brazing layer 54. While rake faces 55 of the diamond composite materials were not more than 0.2 μm in surface roughness $R_{max}$ in all such cutting tools, those exceeding 0.15 μm in surface roughness were slightly polished to be not more than 0.1 μm in $R_{max}$.

Figure 6:
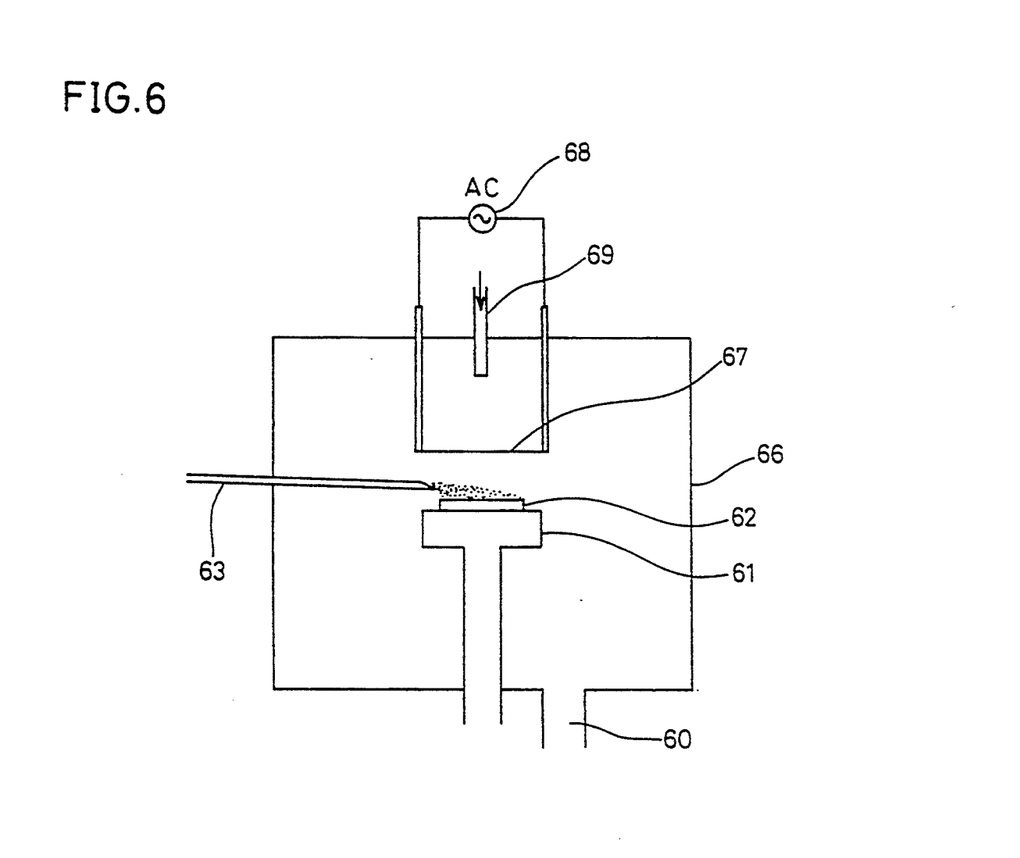
FIG. 6 is a model diagram showing another apparatus for manufacturing a diamond composite material.

FIG. 6 shows another apparatus for forming a diamond composite material which is to be used for a cutting edge in manufacturing the diamond cutting tool according to the present invention. FIG. 6 is a conceptual diagram showing a thermal filament CVD apparatus employing a thermal filament heated to a high temperature for decomposing/activating a raw material gas. A filament 67, being formed by 10 W wires of 0.4 mm in diameter horizontally extended with tension at intervals of 4 mm, is provided in a vacuum chamber 66 which is exhaustible through an exhaust port 60. This filament 67 is heated to a prescribed temperature by an AC heating power source 68. A raw material gas is introduced into the vacuum chamber 66 through a gas supply nozzle 69. A substrate 62 which is fixed to a support 61 is provided immediately under the filament 67, so that diamond is grown on its surface. Simultaneously with the growth of diamond, fine powder and fiber of a metal or ceramics or the like is supplied onto the substrate 62 though a nozzle 63, so that a composite layer containing the metal or ceramics and the diamond in a mixed state is formed on the substrate surface. Thus, it is possible to form a diamond composite material having a proper thickness.

In the apparatus having the aforementioned structure, diamond composite materials were formed on Si substrates that were 1 in. square and were mirror-finished to be not more than 0.1 μm in $R_{max}$ and ground with diamond powder of #5000 grit, and on Mo substrates that were 1 in. square and were similarly mirror-finished and ground with diamond powder of #1000 grit, under conditions shown in Table 3 respectively. Then, the Si substrates and the Mo substrates were dissolved and removed by a mixed solution of hydrofluoric acid and nitric acid and aqua regia respectively, to obtain respective diamond composite materials. The as-obtained diamond composite materials were brazed as cutting edges to bases of cemented carbide in procedures similar to the above, and finally edged to complete cutting tools. In such tools, the rake faces of the diamond composite materials were not more than 0.2 μm in surface roughness $R_{max}$ in all of those formed on the Si substrates, while those formed on Mo substrates included some having rake faces exceeding 0.2 μm in $R_{max}$. Among these, the rake faces exceeding 0.15 μm in surface roughness were slightly polished to be not more than 0.1 μm in $R_{max}$.

TABLE 3

| Example | Raw Material Gas CH$_4$/C$_2$H$_5$OH/H$_2$ (L/min.) | Pressure (Torr) | Filament Temperature (°C) | Temperature of Base Material Surface (°C) | Base Material | Supplied Material | Size of Supplied Material (μm) | Amount of Supply (mg/min.) | Thickness Composite Layer (μm) | Total Thickness (μm) | Deposition Time Composite Layer (hr) | Total Thickness (hr) | Remarks |
|---|---|---|---|---|---|---|---|---|---|---|---|---|---|
| 11 | 0.04/0/2 | 100 | 2150 | 900 | Si | SiC Powder | 3–8 | 130 | 50 | 300 | 14 | 114 | |
| 12 | 0.05/0/2 | 150 | 2200 | 950 | Si | Sic Powder | 8–16 | 160 | 100 | 400 | 18 | 93 | |
| 13 | 0.04/0/2 | 100 | 2150 | 900 | Si | SiC Whisker | φ2 × 30 | 90 | 100 | 400 | 28 | 148 | |
| 14 | 0.05/0/2 | 150 | 2200 | 950 | Si | SiC Whisker | φ5 × 50 | 150 | 150 | 500 | 24 | 114 | |
| 15 | 0/0.03/2 | 200 | 2250 | 1000 | Si | Si$_3$N$_4$ Powder | 8–16 | 240 | 100 | 400 | 12 | 62 | |
| 16 | 0.04/0/2 | 100 | 2150 | 900 | Si | c-BN Powder | 3–8 | 110 | 50 | 300 | 15 | 115 | |
| 17 | 0.04/0/2 | 100 | 2150 | 900 | Si | c-BN Powder | 8–16 | 100 | 75 | 300 | 20 | 110 | |
| 18 | 0.05/0/2 | 150 | 2200 | 900 | Si | c-BN Powder | 8–16 | 160 | 100 | 400 | 18 | 93 | |
| 19 | 0.05/0/2 | 150 | 2200 | 950 | Si | c-BN Powder | 20–30 | 150 | 150 | 500 | 25 | 115 | |
| 20 | 0/0.03/2 | 200 | 2250 | 1000 | Mo | TaC Powder | 20–30 | 930 | 200 | 500 | 22 | 72 | |
| 21 | 0/0.03/2 | 200 | 2250 | 1000 | Mo | WC Powder | 8–16 | 1100 | 100 | 400 | 12 | 62 | |
| 22 | 0/0.03/2 | 200 | 2250 | 1000 | Mo | Tic Powder | 8–16 | 350 | 150 | 400 | 18 | 40 | |
| 23 | 0.05/0/2 | 150 | 2200 | 950 | Mo | B$_4$C Powder | 3–8 | 130 | 80 | 300 | 14 | 55 | |
| 24 | 0.04/0/2 | 100 | 2150 | 900 | Si | None | | | | 300 | | 120 | Comparative Example |
| 25 | 0.05/0/2 | 150 | 2200 | 950 | Si | None | | 0 | 0 | 400 | | 100 | Comparative Example |
| 26 | 0/0.03/2 | 200 | 2250 | 1000 | Mo | None | | 0 | 0 | 500 | | 85 | Comparative Example |

In order to evaluate the performance of the diamond cutting tools prepared in the aforementioned manner, cutting tests were carried out under the following conditions:

(Cutting Conditions A)

Workpiece: round bar of A390—T6 (Al—17% Si) provided with eight grooves having V-shaped sections along the axial direction
Cutting Speed: 600 m/min.
Depth of Cut: 0.5 mm
Feed Rate: 0.12 mm/rev.
Coolant: water-soluble oil solution (Cutting Conditions B)

Workpiece: round bar formed by mechanically bonding AC 8A (Al—12% Si) with FCD 20 at a central portion so that AC 8A and FCD 20 were peripherally milled half by half in a co-cutting manner
Cutting Speed: 200 m/min.
Depth of Cut: 0.20 mm/min.
Feed Rate: 0.1 mm/rev.
Coolant: water-soluble oil solution Table 4 shows the results of the two types of cutting tests.

TABLE 4

| Sample | Cutting Test A Flank Wear Width (μm) | | Cutting Test B Flank Wear Width (μm) | |
|---|---|---|---|---|
| | After Cutting for 5 min. | After Cutting for 60 min. | After Cutting for 5 min. | After Cutting for 60 min. |
| 1 | 25 | 85 | Unpracticed | Unpracticed |
| 2 | 33 | 110 | Unpracticed | Unpracticed |
| 3 | 21 | 79 | Unpracticed | Unpracticed |
| 4 | 28 | 100 | Unpracticed | Unpracticed |
| 5 | 19 | 73 | Unpracticed | Unpracticed |
| 6 | 15 | 70 | 22 | 76 |
| 7 | 20 | 75 | 25 | 85 |
| 8 | 27 | 94 | 27 | 88 |
| 9 | 31 | 104 | 30 | 102 |
| 10* | 45 | Chipped | 53 | Chipped |
| 11 | 21 | 83 | Unpracticed | Unpracticed |
| 12 | 24 | 86 | Unpracticed | Unpracticed |
| 13 | 18 | 72 | Unpracticed | Unpracticed |
| 14 | 26 | 91 | Unpracticed | Unpracticed |
| 15 | 30 | 98 | Unpracticed | Unpracticed |
| 16 | 14 | 67 | 19 | 71 |
| 17 | 19 | 73 | 20 | 78 |
| 18 | 21 | 88 | 23 | 83 |
| 19 | 25 | 96 | 24 | 90 |
| 20 | 30 | 100 | Unpracticed | Unpracticed |
| 21 | 25 | 91 | Unpracticed | Unpracticed |
| 22 | 27 | 96 | Unpracticed | Unpracticed |
| 23 | 24 | 84 | Unpracticed | Unpracticed |
| 24* | 35 | Chipped | 36 | Chipped |
| 25* | 37 | Chipped | 43 | Chipped |
| 26* | 42 | Chipped | 48 | Chipped |

*Comparative Example

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cutting tool comprising a tool substrate comprising a tool material, and a cutting edge member brazed onto said tool substrate, said cutting edge member comprising a first layer consisting essentially of vapor-deposited polycrystalline diamond and having a crystal growth start surface defining a rake face of said cutting edge member and having an inner surface opposite said crystal growth start surface and wherein a maximum content of diamond having a minimum crystal grain diameter is present at said rake face, a second layer formed on said inner surface of said first layer and consisting essentially of vapor-deposited polycrystalline diamond and a second layer material selected from the group consisting of metals, ceramics and combinations thereof, said second layer material having a linear expansion coefficient between that of said tool material and that of polycrystalline diamond, and a third layer formed on said second layer and consisting essentially of a third layer material selected from said group consisting of metals, ceramics and combinations thereof, wherein said cutting edge member is brazed onto said tool substrate via said third layer.

2. The cutting tool of claim 1, wherein said cutting edge member has a twisted shape.

3. The cutting tool of claim 1, wherein said metals comprise materials selected from the group consisting of Mo, W, Cr, V, Nb, Ta, Co, Ni and Fe, and said ceramics comprise materials selected from the group consisting of cBN, SiC, $Si_3N_4$, WC, BN, TiC, TaC, NbC, $Cr_3C_2$, $Mo_2C$, VC and TiN.

4. The cutting tool of claim 3, wherein said second layer contains a larger proportion of said ceramics than said third layer contains, and said third layer contains a larger proportion of said metals than said second layer contains.

5. The cutting tool of claim 1, wherein said first layer has a thickness of at least about 40 μm, said second layer has a thickness in a range of about 10 μm to about 300 μm, and said third layer has a thickness in a range of about 50 μm to about 2000 μm.

6. The cutting tool of claim 1, wherein said rake face has a surface roughness $R_{max}$ of not more than 0.2 μm.

7. The cutting tool of claim 1, wherein said tool material consists essentially of a material selected from the group consisting of super alloys, cemented carbides and high-speed steels.

8. The cutting tool of claim 1, wherein said tool material consists essentially of a cemented carbide, and said metals comprise materials selected from the group consisting of Mo and W, and said ceramics comprise materials selected from the group consisting of SiC and $Si_3N_4$.

9. The cutting tool of claim 1, wherein said cutting edge member has a thickness in a range of about 100 μm to about 1000 μm.

10. The cutting tool of claim 1, further comprising a metallization layer consisting essentially of a metal or semi-metal element selected from groups IIIb, IVa, IVb, Va, Vb, VIa, VIb, VIIa and VIII of the periodic table, and alloys thereof and compounds thereof wherein said metallization layer is provided between said third layer and said tool substrate for improving said brazed attachment of said cutting edge member onto said tool substrate.

11. A cutting tool comprising a tool substrate made of a tool material, and a cutting edge member attached to said tool substrate, said cutting edge member having a cutting edge and a rake face and comprising a composite material forming said rake face comprising at least one reinforcement material selected from the group consisting of particles and fibers, and a matrix material bonding said reinforcement material, wherein said reinforcement material consists essentially of at least one material selected from the group consisting of Si, B, Ge, transition metals belonging to groups IVa, Va and VIa of the periodic table, oxides, nitrides, carbides, carbonitrides and borides of B, Al, Si and transition metals belonging to groups IVa, Va and VIa of the periodic table, and diamond, and wherein said matrix material consists essentially of vapor-deposited polycrystalline diamond and wherein said rake face is a crystal growth start surface.

12. The cutting tool of claim 11, wherein said reinforcement material comprises particles of cubic BN and at least a portion of said particles are substantially uniformly oriented with respect to a (111) plane of said cubic BN, and wherein said polycrystalline diamond comprises diamond crystals oriented with a (111) principal crystal plane substantially in parallel with said rake face.

13. The cutting tool of claim 12, wherein said diamond crystals are oriented with respect to said rake face in a region extending from said rake face to a depth of at least about 50 µm from said rake face.

14. The cutting tool of claim 11, wherein said reinforcement material consists essentially of at least one material selected from the group consisting of AlN, BN, $B_4C$, SiC, $Si_3N_4$, TiC, TiN, Ti(CN), $TiB_2$, $Mo_2C$, TaC, NbC, VC and WC.

15. The cutting tool of claim 11, wherein said reinforcement material comprises particles that have a mean diameter in a range of about 1 µm to about 50 µm.

16. The cutting tool of claim 11, wherein said reinforcement material comprises fibers that have a mean diameter in a range of about 1 µm to about 50 µm.

17. The cutting tool of claim 11, wherein said composite material has a thickness in a range of about 200 µm to about 500 µm.

18. The cutting tool of claim 11, wherein said composite material of said cutting edge member is attached to said tool substrate by brazing.

19. The cutting tool of claim 11, wherein said tool material consists essentially of a material selected from the group consisting of super alloys, cemented carbides and high-speed steels.

20. A method of manufacturing a cutting tool having a tool substrate and a cutting edge member containing vapor-deposited polycrystalline diamond and being brazed onto said tool substrate, said method comprising the following steps:
(a) forming a diamond layer on a base material by vapor deposition;
(b) forming an intermediate layer on said diamond layer formed in said step (a), by vapor depositing diamond and at least one material selected from the group consisting of metals and ceramics having a linear expansion coefficient between that of said tool substrate and that of diamond, by supplying a powder of said at least one material during said vapor depositing of this step (b);
(c) forming a non-diamond layer by stopping deposition of said diamond and depositing said at least one material;
(d) removing said base material from said diamond layer for obtaining said cutting edge member having a laminate structure including said diamond layer, said intermediate layer and said non-diamond layer; and
(e) brazing said cutting edge member onto said tool substrate so that a surface of said diamond layer that had been in contact with said base material defines a rake face.

21. A method of manufacturing a cutting tool containing vapor-deposited polycrystalline diamond in a cutting edge of said tool, said method comprising the following steps:
(a) preparing a base material having a mirror-finished surface;
(b) depositing diamond on said surface by vapor deposition while supplying particles consisting essentially of at least one material selected from the group consisting of Si, B, Ge, transition metals belonging to the groups IVa, Va and VIa of the periodic table, oxides, nitrides, carbides, carbonitrides and borides of B, Al, Si and transition metals belonging to groups IVa, Va and VIa of the periodic table and diamond;
(c) removing said base material for obtaining a diamond composite material consisting essentially of said at least one material and diamond; and
(d) brazing said diamond composite material onto a tool substrate so that a surface of said diamond composite material that had been in contact with said base material defines a rake face of said cutting edge.

22. The cutting tool of claim 1, wherein said linear expansion coefficient of said second layer material is closer to the linear expansion coefficient of said tool material than that of said polycrystalline diamond.

23. The method of claim 20, wherein said linear expansion coefficient of said at least one material is closer to the linear expansion coefficient of the material of said tool substrate than that of said diamond.

24. The cutting tool of claim 11, wherein said cutting edge member is resistant to a chemical decomposition reaction of diamond to non-diamond carbon during cutting of a ferrous material.

* * * * *